United States Patent
Yi

(10) Patent No.: US 11,217,607 B2
(45) Date of Patent: Jan. 4, 2022

(54) DISPLAY PANEL AND ELECTRONIC DEVICE

(71) Applicant: Shenzhen China Star Optoelectronics Semiconductor Display Technology Co., Ltd., Shenzhen (CN)

(72) Inventor: Ningbo Yi, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 263 days.

(21) Appl. No.: 16/625,219

(22) PCT Filed: Dec. 17, 2019

(86) PCT No.: PCT/CN2019/126089
§ 371 (c)(1),
(2) Date: Dec. 20, 2019

(87) PCT Pub. No.: WO2021/103203
PCT Pub. Date: Jun. 3, 2021

(65) Prior Publication Data
US 2021/0335829 A1  Oct. 28, 2021

(30) Foreign Application Priority Data

Nov. 27, 2019 (CN) .......................... 201911178240.X

(51) Int. Cl.
*H01L 27/14* (2006.01)
*H01L 27/12* (2006.01)

(52) U.S. Cl.
CPC ........ *H01L 27/124* (2013.01); *H01L 27/1255* (2013.01)

(58) Field of Classification Search
CPC .......................... H01L 27/124; H01L 27/1255
USPC ...................................... 257/59, 71, 72, 432
See application file for complete search history.

(56) References Cited

U.S. PATENT DOCUMENTS 10,585,320 B2 * 3/2020 Xu .................... H01L 29/78648

* cited by examiner

*Primary Examiner* — Tan N Tran
(74) *Attorney, Agent, or Firm* — Luedeka Neely Group, P.C.

(57) ABSTRACT

The present disclosure provides a display panel and an electronic device. The display panel includes a plurality of pixels, and the pixels include a main-pixel region and a sub-pixel region. The main-pixel region includes a common electrode portion including a sharing electrode, and a voltage of the sharing electrode is a fixed value. The sub-pixel region comprises a sub-driving thin film transistor and a sharing thin film transistor, wherein a drain of the sharing thin film transistor is connected to the sharing electrode, and a source of the sharing thin film transistor is connected to a drain of the sub-driving thin film transistor.

10 Claims, 3 Drawing Sheets

DISPLAY PANEL AND ELECTRONIC DEVICE

FIELD OF INVENTION

The present disclosure relates to the field of display technologies, and more particularly, to a display panel and an electronic device.

BACKGROUND OF INVENTION

To improve viewing angles, pixel structures of display panels change from 4 display domains to 8 display domains, and how to improve the chromatic polarization of wide viewing angles has become a hot research topic.

To improve the chromatic polarization of wide viewing angles, each pixel is divided into a main-pixel region and a sub-pixel region. Usually a sharing electrode is made respectively in the 8 display domain pixels, and a drain of a sharing thin film transistor is connected to the sharing electrode, thus sharing the charge of the sub-pixel region through the sharing electrode, changing a brightness of the sub-pixel region and the main-pixel region, and improving the problem of the chromatic polarization of wide viewing angles. However, the sharing electrode in the prior art located in the opening region, thereby reducing the opening ratio.

Therefore, it is necessary to provide a display panel and an electronic device to solve the problems in the prior art.

SUMMARY OF INVENTION

An object of the present disclosure is to provide a display panel and an electronic device, which can increase the opening ratio.

To solve the above problems, the present disclosure provides a display panel, the display panel includes a plurality of data lines, a plurality of scan lines, and a plurality of pixels defined by the plurality of data lines and the plurality of scan lines, wherein the pixel includes:

a main-pixel region including a common electrode portion and a first pixel electrode; the common electrode portion including a sharing electrode, a voltage of the sharing electrode is a fixed value;

a sub-pixel region including a second common electrode and a second pixel electrode, the sub-pixel region further including a sub-driving thin film transistor and a sharing thin film transistor, a drain of the sharing thin film transistor is connected to the sharing electrode, a source of the sharing thin film transistor is connected to a drain of the sub-driving thin film transistor, so that a voltage of the sub-pixel region and a voltage of the main-pixel region are different.

The present disclosure further provides an electronic device, including the display panel described above.

The present disclosure provides a display panel and an electronic device. The display panel includes a plurality of pixels, and the pixel includes: a main-pixel region, including a common electrode portion including a sharing electrode, wherein a voltage of the sharing electrode is a fixed value; and a sub-pixel region, including a sub-driving thin film transistor and a sharing thin film transistor, wherein a drain of the sharing thin film transistor is connected to the sharing electrode, and a source of the sharing thin film transistor is connected to a drain of the sub-driving thin film transistor, so that a voltage of the sub-pixel region and a voltage of the main-pixel region are different. By improving the first common electrode to form the sharing electrode, the sharing electrode is located on a non-opening region, thereby increasing the opening ratio.

DETAILED DESCRIPTION OF PREFERRED EMBODIMENTS

Figure 1:
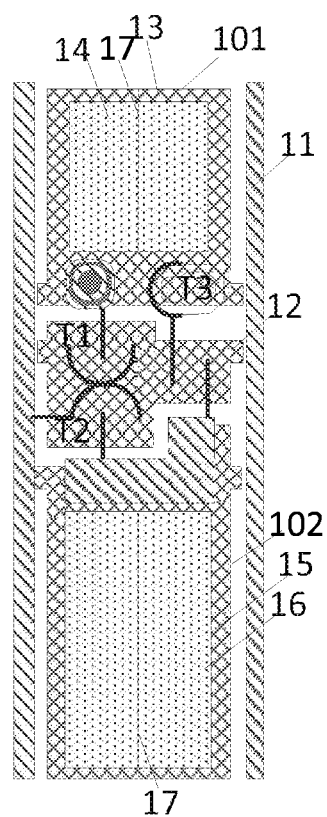
FIG. 1 is a first schematic structural diagram of a current display panel.

The following descriptions of the embodiments are with reference to the attached figures to illustrate specific embodiments that can be implemented of the present disclosure. The directional terms mentioned in the present disclosure, such as "upper", "lower", "before", "after", "left", "right", "inside", "outside", "side", etc., are only attached the directional terms used in the figures to explain and describe the present disclosure, not intended to limit the scope of the present disclosure. In the figures, the same structural components denoted by the same reference numerals.

As shown in FIG. 1, the current display panel includes a data line 11, a scan line 12, and a pixel defined by the data line 11 and the scan line 12. The pixel includes a main-pixel region 101 and a sub-pixel region 102. The main-pixel region 101 includes a first common electrode 13 and a first pixel electrode 14, and further includes a main-driving thin film transistor T1. The sub-pixel region 102 includes second common electrode 15 and a second pixel electrode 16, and further includes a sub-driving thin film transistor T2 and a sharing thin film transistor T3. A gate of the main-driving thin film transistor T1, a gate of the sub-driving thin film transistor T2, and a gate of the sharing thin film transistor T3 are connected to the scan line 12. A source of the main-driving thin film transistor T1 and a source of the second thin film transistor T2 are connected to the data line 11. A drain of the sub-driving thin film transistor T2 is respectively connected to a second pixel electrode 16 and a source of the sharing thin film transistor T3, and a drain of the sharing thin film transistor T3 is connected to a sharing electrode 17.

Figure 2:
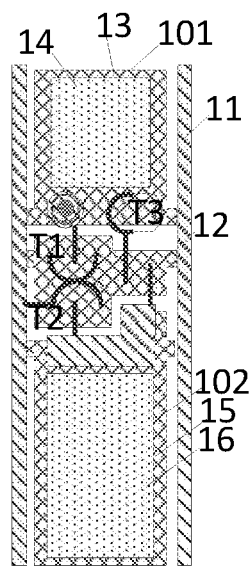
FIG. 2 is a second schematic structural diagram of a current display panel.

With the continuous improvement of resolutions, pixel sizes have been limited due to the limitation of display panel sizes, and it is impossible to introduce the sharing electrode to the pixel design of display panels. For example, for an 85-inch display panel with 8K (7680*4320) resolution, the sub-pixels reach 81 um in the lateral direction, and there is enough space to introduce the sharing electrode to the first metal layer. However, as shown in FIG. 2, for an 75-inch display panel with 8K resolution, the sub-pixel size is only about 71 um, and due to the limitation of process and material, it is impossible to separately introduce the sharing electrode to the first metal layer, and can only allow a drain of the third thin film transistor connected to the common electrode. Although this design can improve the viewing angle, fluctuating voltages of the common electrode cause a fluctuating charge of the storage capacitor, which leads to crosstalk of the display panel, and this affects the display image quality. Of course, display panels at 8K resolution of 65 inches and display panels in an even smaller size will face the same problem.

Figure 3:
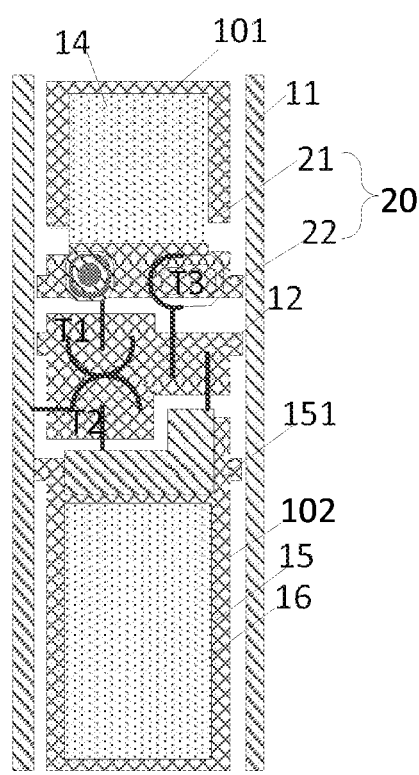
FIG. 3 is a schematic structural diagram of a display panel of a first embodiment of the present disclosure.
Figure 4:
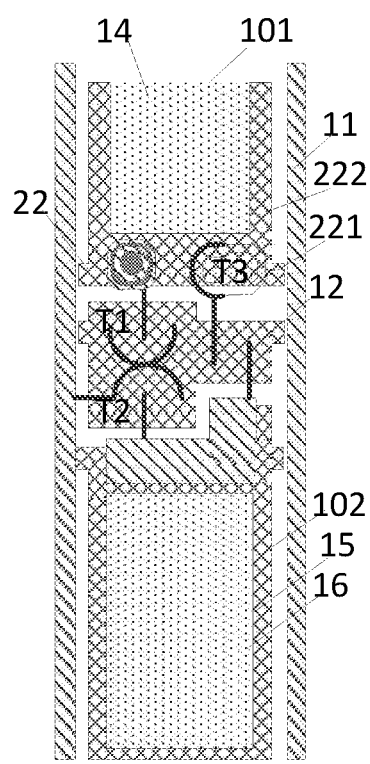
FIG. 4 is a schematic structural diagram of a display panel of a second embodiment of the present disclosure.

Please refer to FIG. 3 and FIG. 4, wherein the FIG. 3 is a schematic structural diagram of a display panel of a first embodiment of the present disclosure.

A display panel of this embodiment includes a plurality of data lines 11, a plurality of scan lines 12, and a plurality of pixels defined by the plurality of data lines 11 and the plurality of scan lines 12. As shown in FIG. 3, a single pixel is illustrated as an example.

The pixel includes: a main-pixel region 101 and a sub-pixel region 102.

The main-pixel region 101 includes a common electrode portion 20 and a first pixel electrode 14. The common electrode portion 20 includes a first pixel electrode 21 and a sharing electrode 22. The first common electrode 21 and the sharing electrode 22 are spaced from each other.

In an embodiment, to simplify the manufacturing process and improve production efficiency, the sharing electrode 22 is close to the sub-pixel region 102, and the first common electrode 21 is located on the sharing electrode 22. In addition, since the sharing electrode is close to the sub-pixel region, it can also reduce the length of the connection line between a sharing thin film transistor and the sharing electrode to prevent large voltage loss, thereby improving display quality.

In an embodiment, to further improve the display quality, the sharing electrode 22 is located on one side of a periphery of the first pixel electrode 14, and the first common electrode 21 is located on a remaining side of the periphery of the first pixel electrode 14. For example, the sharing electrode 22 is located on a lower side of the first pixel electrode 14, the first common electrode 21 is located on a left, right, and upper side of the first pixel electrode 14.

A voltage of the sharing electrode 22 is a fixed value; in other words, the voltage of the sharing electrode 22 is constant. Preferably, the sharing electrode 22 is continuously connected to a constant voltage. For example, the sharing electrode 22 can be powered by an external constant voltage power source independently.

The main-pixel region 101 further includes a main-driving thin film transistor T1, and a drain of the main-driving thin film transistor T1 is connected to the first pixel electrode 14.

The sub-pixel region 102 includes a second common electrode 15 and a second pixel electrode 16, wherein the second common electrode 15 is disposed on a periphery of the second pixel electrode 16. In an embodiment, to prevent influencing open ratio, the second common electrode 15 includes a third sub-portion 151 which covers a drain of a sub-driving thin film transistor T2 and a source of a sharing thin film transistor T3. The third sub-portion 151 is a portion located above the second pixel electrode 16. The second common electrode 15 further includes a fourth sub-portion (not shown in the figure). The fourth sub-portion is located on the left, right and the lower side of the second pixel electrode 16. It can be understood that the shape of the first pixel electrode 14 and the second pixel electrode 16 may be "a Union Jack double-cross" shape, and of course, they may be in other shape.

The sub-pixel region 102 further includes a sub-driving thin film transistor T2 and a sharing thin film transistor T3, wherein a drain of the sharing thin film transistor T3 is connected to the sharing electrode 22, and a source of the sharing thin film transistor T3 is connected to a drain of the sub-driving thin film transistor T2, so a voltage of the sub-pixel region 102 and a voltage of the main-pixel region 101 and the brightness of the two are different to prevent the chromatic polarization of large viewing angles.

A gate of the main-driving thin film transistor T1, a gate of the sub-driving thin film transistor T2, and a gate of the sharing thin film transistor T3 are connected to the scan line 12.

A source of the main-driving thin film transistor T1 and a source of the second thin film transistor T2 are connected to the data line 11.

The drain of the sub-driving thin film transistor T2 is respectively connected to the second pixel electrode 16 and the source of the sharing thin film transistor T3.

The common electrode portion 20 is located on the same metal layer as the gate of the main-driving thin film transistor T1, the gate of the sub-driving thin film transistor T2, and the gate of the sharing thin film transistor T3. For example, the gate of the main-driving thin film transistor T1, the gate of the sub-driving thin film transistor T2, and the gate of the sharing thin film transistor T3 are located on the first metal layer, and the common electrode portion 20 is also located on the first metal layer, thereby simplifying the manufacturing process, and reducing the thickness of the display panel.

To improve the reliability of the connection and prevent affecting the aperture ratio, the sharing electrode 22 covers the drain of the main-driving thin film transistor T1 and the drain of the sharing thin film transistor T3.

By dividing the current first common electrode, the sharing electrode, and the common electrode of the main-pixel region are formed, so that the sharing electrode located in the non-opening region, thereby increasing the opening ratio. In addition, it can prevent the common electrode from connecting to the sharing electrode, therefore preventing the voltage of the common electrode from fluctuating, the charge of the storage capacitor from fluctuating, the display panel from crosstalk, and improving the display picture quality.

Please refer to FIG. 4, FIG. 4 is a schematic structural diagram of a display panel of a second embodiment of the present disclosure.

As shown in FIG. 4, the difference between this embodiment and the above embodiment is that the common electrode portion of this embodiment only includes the sharing electrode 22.

Specifically, the sharing electrode 22 includes a first sub-portion 221 and a second sub-portion 222, the first sub-portion 221 is close to the sub-pixel region 102, and the second sub-portion 222 is located on both sides of the first sub-portion 221. For example, the first sub-portion 221 is located under the first pixel electrode 14, the second sub-portion 222 is located on both sides of the first pixel electrode 14. It can be understood that the storage capacitor of the main-pixel region in this embodiment is formed by the sharing electrode 22 and the first pixel electrode 14.

The first sub-portion 221 is arranged along a first direction, the second sub-portion 222 is arranged along a second direction, wherein the first direction is perpendicular to the second direction. For example, the first sub-portion 221 arranged in a horizontal direction, and the second sub-portion 222 arranged in a vertical direction.

By improving the current first common electrode, the sharing electrode is formed and located in a non-opening region, thereby increasing the opening ratio. In addition, since the sharing electrode continuously receives a constant voltage, the effect of charge sharing on the voltage of the sharing electrode is small, which can prevent the fluctuation of the charge of the storage capacitor, thereby preventing crosstalk on the display panel, and improving the display image quality.

The present disclosure further provides an electronic device, which includes any one of the above display panels, and the electronic device may be a device such as a mobile phone or a tablet computer.

The present disclosure provides a display panel and an electronic device, including a plurality of pixels, and the pixel includes a main-pixel region and a sub-pixel region. The main-pixel region includes a common electrode portion including a sharing electrode, wherein a voltage of the sharing electrode is a fixed value. The sub-pixel region comprises a sub-driving thin film transistor and a sharing thin film transistor, wherein a drain of the sharing thin film transistor is connected to the sharing electrode, and a source of the sharing thin film transistor is connected to a drain of the sub-driving thin film transistor, so that a voltage of the sub-pixel region and a voltage of the main-pixel region are different. By improving the first common electrode to form the sharing electrode, the sharing electrode is formed and located on a non-opening region, thereby increasing the opening ratio.

In summary, although the preferable embodiments of the present disclosure have been disclosed above, the above preferred embodiments are not intended to limit the present disclosure. Those skilled in the art can make various modifications without departing from the spirit and scope of the present disclosure, the protection scope of the present disclosure is defined by the scope of claims.

What is claimed is:

1. A display panel, comprising a plurality of data lines, a plurality of scan lines, and a plurality of pixels defined by the plurality of data lines and the plurality of scan lines, wherein the pixel comprises:

a main-pixel region comprising a common electrode portion and a first pixel electrode, wherein the common electrode portion comprises a sharing electrode, and a voltage of the sharing electrode is a fixed value; and the common electrode portion comprises a first common electrode; and a sub-pixel region comprising a second common electrode and a second pixel electrode, wherein the sub-pixel region further comprises a sub-driving thin film transistor and a sharing thin film transistor, a drain of the sharing thin film transistor is connected to the sharing electrode, and a source of the sharing thin film transistor is connected to a drain of the sub-driving thin film transistor, so that a voltage of the sub-pixel region and a voltage of the main-pixel region are different; wherein the first common electrode and the sharing electrode are spaced from each other, the sharing electrode is close to the sub-pixel region, and the first common electrode is located on the sharing electrode; wherein the sharing electrode is located on one side of a periphery of the first pixel electrode, and the first common electrode is located on a remaining side of the periphery of the first pixel electrode; wherein the sharing electrode comprises a first sub-portion and a second sub-portion, the first sub-portion is close to the sub-pixel region, and the second sub-portion is located on both sides of the first sub-portion; and wherein the first sub-portion is arranged along a first direction, and the second sub-portion is arranged along a second direction, wherein the first direction is perpendicular to the second direction.

2. The display panel as claimed in claim 1, wherein
the main-pixel region further comprises a main-driving thin film transistor, and a drain of the main-driving thin film transistor is connected to the first pixel electrode;

a gate of the main-driving thin film transistor, a gate of the sub-driving thin film transistor, and a gate of the sharing thin film transistor are connected to the scan line;

a source of the main-driving thin film transistor and a source of the second thin film transistor are connected to the data line; and the drain of the sub-driving thin film transistor is respectively connected to the second pixel electrode and the source of the sharing thin film transistor.

3. The display panel as claimed in claim 2, wherein
the common electrode portion is located on a same metal layer as the gate of the main-driving thin film transistor, the gate of the sub-driving thin film transistor, and the gate of the sharing thin film transistor.

4. The display panel as claimed in claim 2, wherein
the sharing electrode covers the drain of the main-driving thin film transistor and the drain of the sharing thin film transistor.

5. The display panel as claimed in claim 1, wherein
the second common electrode comprises a third sub-portion which covers the drain of the sub-driving thin film transistor and the source of the sharing thin film transistor.

6. An electronic device, comprising a display panel, wherein the display panel comprises a plurality of data lines, a plurality of scan lines, and a plurality of pixels defined by the plurality of data lines and the plurality of scan lines, wherein the pixel comprises:

a main-pixel region comprising a common electrode portion and a first pixel electrode, wherein the common electrode portion comprises a sharing electrode, and a voltage of the sharing electrode is a fixed value; and the common electrode portion comprises a first common electrode; and a sub-pixel region comprising a second common electrode and a second pixel electrode, wherein the sub-pixel region further comprises a sub-driving thin film transistor and a sharing thin film transistor, a drain of the sharing thin film transistor is connected to the sharing electrode, and a source of the sharing thin film transistor is connected to a drain of the sub-driving thin film transistor, so that a voltage of the sub-pixel region and a voltage of the main-pixel region are different; wherein the first common electrode and the sharing electrode are spaced from each other, the sharing electrode is close to the sub-pixel region, and the first common electrode is located on the sharing electrode; wherein the sharing electrode is located on one side of a periphery of the first pixel electrode, and the first common electrode is located on a remaining side of the periphery of the first pixel electrode; wherein the sharing electrode comprises a first sub-portion and a second sub-portion, the first sub-portion is close to the sub-pixel region, and the second sub-portion is located on both sides of the first sub-portion; and wherein the first sub-portion is arranged along a first direction, and the second sub-portion is arranged along a second direction, wherein the first direction is perpendicular to the second direction.

7. The electronic device as claimed in claim 6, wherein
the main-pixel region further comprises a main-driving thin film transistor, and a drain of the main-driving thin film transistor is connected to the first pixel electrode;

a gate of the main-driving thin film transistor, a gate of the sub-driving thin film transistor, and a gate of the sharing thin film transistor are connected to the scan lines;

a source of the main-driving thin film transistor and a source of the second thin film transistor are connected to the data line; and the drain of the sub-driving thin film transistor is respectively connected to the second pixel electrode and the source of the sharing thin film transistor.

8. The electronic device as claimed in claim 7, wherein the common electrode portion is located on a same metal layer as the gate of the main-driving thin film transistor, the gate of the sub-driving thin film transistor, and the gate of the sharing thin film transistor.

9. The electronic device as claimed in claim 7, wherein the sharing electrode covers the drain of the main-driving thin film transistor and the drain of the sharing thin film transistor.

10. The electronic device as claimed in claim 6, wherein the second common electrode comprises a third sub-portion which covers the drain of the sub-driving thin film transistor and the source of the sharing thin film transistor.

* * * * *